United States Patent [19]

Sasaki et al.

[11] Patent Number: 4,551,911
[45] Date of Patent: Nov. 12, 1985

[54] METHOD FOR MANUFACTURING SEMICONDUCTOR DEVICE

[75] Inventors: Gen Sasaki, Yokohama; Shuichi Kameyama, Itami, both of Japan

[73] Assignee: Tokyo Shibaura Denki Kabushiki Kaisha, Kawasaki, Japan

[21] Appl. No.: 563,105

[22] Filed: Dec. 16, 1983

[30] Foreign Application Priority Data

Dec. 28, 1982 [JP] Japan .................. 57-233541

[51] Int. Cl.⁴ ................ H01L 21/82; H01L 21/312; H01L 21/26
[52] U.S. Cl. .................. 29/576 W; 29/571; 29/578; 148/1.5; 148/DIG. 10; 148/DIG. 11; 148/DIG. 50; 357/34; 357/55; 156/648; 156/643
[58] Field of Search .............. 29/571, 576 R, 576 A, 29/578; 148/1.5, DIG. 50, DIG. 10, DIG. 11; 357/34, 55; 156/648, 643

[56] References Cited

U.S. PATENT DOCUMENTS

| 4,243,435 | 1/1981 | Barile et al. ............... 357/34 X |
| 4,372,030 | 2/1983 | Saitoh ..................... 29/576 W X |
| 4,445,967 | 5/1984 | Kameyama .................. 29/576 W X |

FOREIGN PATENT DOCUMENTS

| 0054651 | 3/1983 | Japan ..................... 29/576 W |
| 0134443 | 8/1983 | Japan ..................... 29/576 W |

OTHER PUBLICATIONS

Tang, et al., "1.25 μm Deep-Groove-Isolated Self-Aligned ECL Circuits," ISSCC Digest of Technical Papers, pp. 242-243, Feb. 12, 1982.

Primary Examiner—Brian E. Hearn
Assistant Examiner—David A. Hey
Attorney, Agent, or Firm—Finnegan, Henderson, Farabow, Garrett & Dunner

[57] ABSTRACT

A method for manufacturing a semiconductor device which comprises the steps of forming a first groove in that portion of a semiconductor substrate where an isolation is to be formed; selectively forming a second groove narrower than the first groove in that surface region of the semiconductor substrate which is surrounded by said first groove; depositing a masking material over the whole surface of the semiconductor substrate with a thickness less than half the width of the first groove and greater than half the width of the second groove; aniotropically etching the deposited masking material to eliminate substantially its thickness, thus leaving the masking material on the side walls of the first groove and entirely in the second groove; introducing an impurity into the bottom of the first groove to form an impurity region; filling the first groove with an isolating material; and forming a semiconductor element in that section of the semiconductor substrate which is surrounded by an isolation consisting of the impurity region and the isolating material layer in the first groove. The semiconductor-manufacturing method of the invention forms an element isolation consisting of an isolating material filling the first groove and an impurity region, and also an interelement isolation region consisting of an isolating material filling the second groove which is narrower than the first groove, both isolations being formed with high precision.

12 Claims, 20 Drawing Figures

METHOD FOR MANUFACTURING SEMICONDUCTOR DEVICE

BACKGROUND OF THE INVENTION

This invention is related to a method for manufacturing a semiconductor device and more particularly to a method for manufacturing a semiconductor device which improves an isolation technique.

To date, the pn junction isolation process and selective oxidation isolation process have generally been applied in manufacturing a semiconductor device, particularly a bipolar IC. For reference, the pn junction isolation and selective oxidation isolation jointly applied in manufacturing a vertical npn type bipolar transistor will now be described.

Figure 1A:
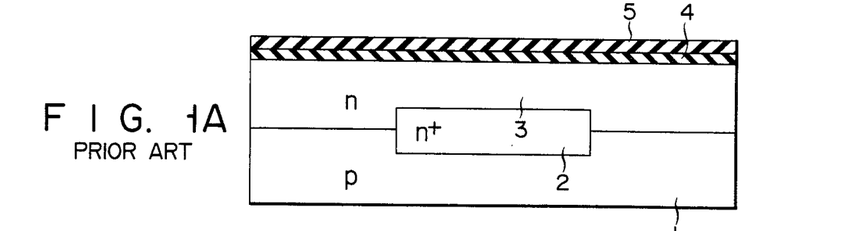
FIGS. 1A to 1E cross sectional views corresponding to the sequential steps of manufacturing an npn type bipolar transistor according to the conventional method.
Figure 1B:
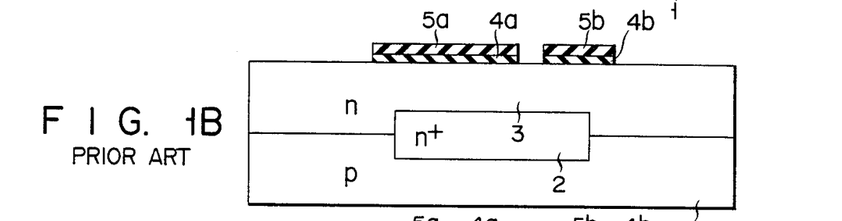
Figure 1C:
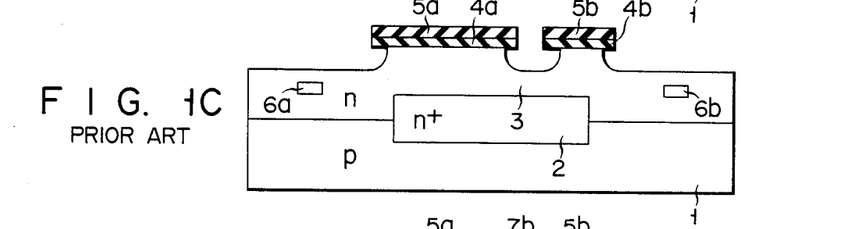

First, as shown in FIG. 1A, an n+ type layer 2 is selectively embedded in a p type silicon substrate 1. Thereafter, an n type silicon layer 3 is deposited by epitaxial growth on said n+ type layer 2. A silicon oxide film 4 is mounted on said n type silicon layer 3 with a thickness of about 1,000 Å A. An oxidation-resistive silicon nitride film 5 is formed on said silicon oxide film 4 with a thickness of about 1,000 Å A. Thereafter, as shown in FIG. 1B, the silicon oxide film 4 and silicon nitride film 5 are photolithographically patterned to provide silicon oxide film patterns 4a, 4b and silicon nitride film patterns 5a, 5b. As shown in FIG. 1C, the n type silicon layer 3 is etched to about 5,000 Å with the silicon oxide film patterns 4a, 4b, and silicon nitride film patterns 5a, 5b used as a mask. An impurity of boron is ion-implanted in the n type silicon layer 3 with the above-mentioned patterns 4a, 4b, 5a, 5b as a mask, thereby producing p type regions 6a, 6b in the n type silicon layer 3. Then as seen from FIG. 1D, silicon oxide films 7a, 7b, 7c are selectively formed by thermal oxidation with a thickness of about 1 micron in steam or a wet atmosphere on those portions of the surface of the silicon layer 3 which are not covered with the silicon nitride film patterns 5a, 5b.

Figure 1D:
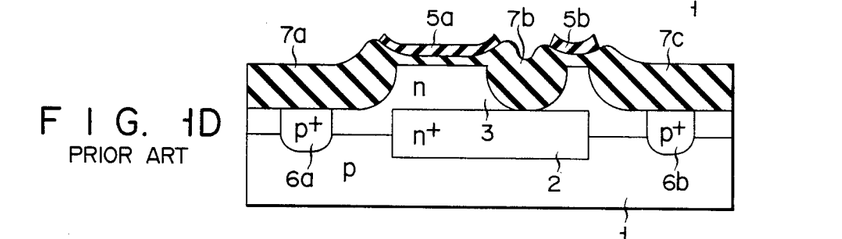
Figure 1E:
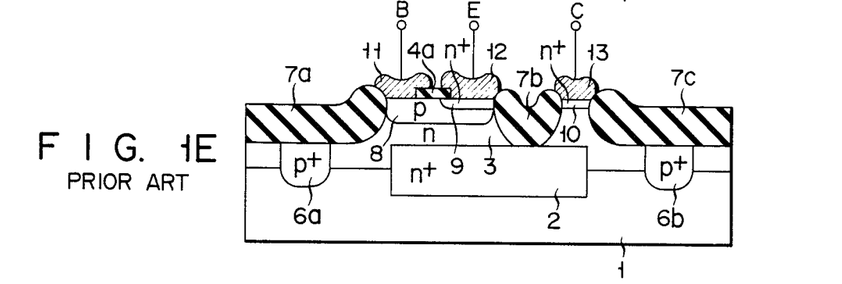
Figure 2:
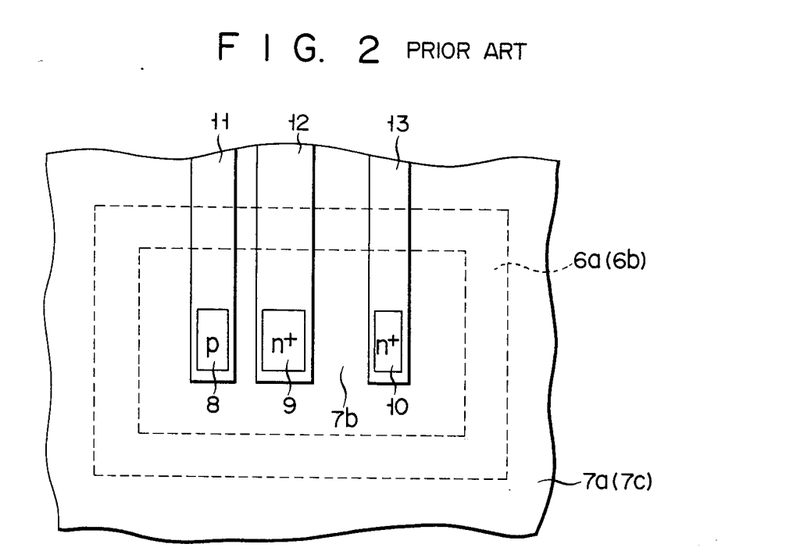
FIG. 2 is a plan view of the transistor of FIG. 1E.

The silicon nitride film patterns 5a, 5b are etched off, for example, by hot phosphoric acid. A p type impurity of, for example, boron is ion-implanted through the silicon oxide film pattern 4a in that portion of the silicon layer 3 which lies beneath the silicon nitride film pattern 5a, thereby producing a base region 8 (FIG. 1E). An n type impurity of, for example, arsenic is ion-implanted in one section of the base region 8 and that portion of the silicon layer 3 which is interposed between the silicon oxide films 7b, 7c, thereby providing an emitter region 9 and collector contact diffusion region 10. Contact holes are drilled in the silicon oxide film patterns 4a, 4b. Thus, an emitter electrode 11, base electrode 12 and collector electrode 13 are produced, in turn, producing a vertical npn type bipolar transistor (FIG. 1E). FIG. 2 is a plan view of the bipolar transistor of FIG. 1E.

In the aforementioned npn transistor, an element is isolated from the other elements by the field oxide films 7a, 7c having a thickness of about one micron and p type regions 6a, 6b. If, in the case, the n type silicon layer 3 is about as thin as 1 to 2 microns, the field oxide film can be brought into contact with the p type substrate 1 by selective oxidation. Therefore, the above-mentioned element isolation can be achieved only by said field oxide film. Even in this case, it is preferable to carry out the ion implantation of a p type impurity near the interface of the p type substrate and field oxide film for the formation of a channel-stopping region in order to suppress current leakage to the other element.

The above-mentioned process of isolating the npn bipolar transistor by the selective oxidation method has the following drawbacks:

(1) The isolation oxide films 7a, 7b, 7c defining the active regions (for example, the base region 8, emitter region 9) of an element have bird's beak-shaped end portions, and tend to undergo significant dimensional change, presenting difficulties in the communication of an element.

(2) For the formation of the p type impurity regions 6a, 6b, a mask has to be aligned with the oxide films 7a, 7b, 7c defining the active regions of an element, thereby obstructing integration.

SUMMARY OF THE INVENTION

It is accordingly the object of this invention to provide a method that enables manufacture of a fine semiconductor device by forming a deep isolation between the elements as well as a shallow isolation in the elements.

A semiconductor device-manufacturing method according to a first embodiment of this invention comprises the steps of selectively etching a semiconductor substrate with a photoresist pattern or oxidation-resistive pattern applied as a mask, thereby providing a first groove in an isolation region and a second groove narrower than the first groove in that portion of the semiconductor substrate which is surrounded by said isolation region. As used herein, a semiconductor substrate is defined to include that, on the surface of which, a semiconductor layer is deposited. The first and second grooves may be formed separately by applying different masks, instead of being formed simultaneously by using the same mask. However, the simultaneous process enables the first and second grooves to be provided in a self-aligned form.

A masking material is retained on the inner side walls of the first groove, and a masking material is filled in the second groove. To be more concrete, the masking material is deposited on the entire surface of the semiconductor substrate, including the inner surface of the first and second grooves, to a thickness less than half the width of the first groove and yet greater than half the width of the second groove. The deposited masking film is anisotropically etched to eliminate substantially its thickness. In this condition, the bottom of the first groove is exposed, and the masking material is retained only on the inner side walls of the first groove. At this time, the second groove remains filled with the masking material. If the masking material is retained on the inner side walls of the first groove and in the second groove even after the subsequent formation of an impurity region, the masking material may include such insulating materials as SiO$_2$, Si$_3$N$_4$, Al$_2$O$_3$, PSG, AsSG, and BSG. If the masking material is taken off from the first and second grooves after the subsequent formation of the impurity region, then the masking material may include not only the above-listed insulating materials but also polycrystalline silicon and amorphous silicon.

Thereafter, an impurity is introduced by thermal diffusion or ion implantation through the bottom of the first groove on the side walls of which the masking material is retained, thereby providing an impurity region. Isolation between the adjacent elements, and isolation between the different sections of the same elements are effected either by filling an isolating material in the first groove without removing the masking material, or by filling the isolating material in the first and second grooves after taking off the masking material from both grooves. When, however, the masking material is retaind in both grooves, the masking material should be an insulating material. $SiO_2$, $Si_3N_4$ and $Al_2O_3$ may be used as isolating materials. Further, as need arises, it is possible to apply low-melting insulating materials such as PSG, AsSG and BSG, as isolating materials. The isolating material layer may contain partly a conductive material such as polycrystalline silicon or metal silicide. If an insulating film is formed to a thickness that does not stop up the first and second grooves by applying oxidation or nitriding to that portion of the semiconductor substrate surface which is exposed on the inner surface of the first and second grooves, then both grooves can be filled with a conductive material. If, in this case, a deposited conductive material is patterned and an insulating material is filled in the patterned segments, then said conductive material pattern can be utilized as an interconnection.

A semiconductor device-manufacturing method according to a first embodiment of this invention enables a deep first isolation between elements and also a second shallow isolation in an element with high precision in a state substantially flush with a semiconductor substrate surface. Therefore, the subject method assures the manufacture of a semiconductor device with high integration and significant reliability.

A semiconductor device-manufacturing method according to a second embodiment of this invention comprises the following steps. As in the first embodiment, a first groove is formed in an isolate region. A second groove, narrower than the first groove, is provided in that portion of the semiconductor substrate which is surrounded by said isolation region. A masking material is retained on the inner side walls of the first groove. A masking material fills the second groove.

Etching is done in that portion of the semiconductor substrate which is exposed on the bottom of the first groove, with inner side walls which are still covered with the masking material, thereby providing a third deep groove narrower than the first groove.

Now let it be assumed that the semiconductor substrate consists of a semiconductor layer of a first conductivity type, a semiconductor layer of a second conductivity type and a high concentration semiconductor region of a second conductivity typ interposed between said semiconductor layers of the first and second conductivity types. If, in this case, the bottom of the first groove is etched to the upper portion of the first conductivity type semiconductor layer, making it possible to isolate not only the second semiconductor layer but also the semiconductor region with every element. If needed, after the above-mentioned step, an impurity region may be formed by introducing an impurity through the bottom of the third groove into the semiconductor substrate by thermal diffusion or ion implantation.

Thereafter, isolations are formed between the adjacent elements or between the different sections of the same element either by inserting an isolating material in the third groove without removing the masking material from the first and second grooves or by removing the masking material from the first and second grooves and filling the first, second and third grooves with an isolating material.

Like the first embodiment, the above-mentioned semiconductor device manfacturing method according to a second embodiment of this invention assures the manufacture of a semiconductor device with high integration and significant reliability.

DETAILED DESCRIPTION OF THE PREFERRED EMBODIMENTS

Examples of this invention which are adapted for the manufacture of an npn type bipolar transistor will now be described with reference to the accompanying drawings.

EXAMPLE 1

Figure 3A:
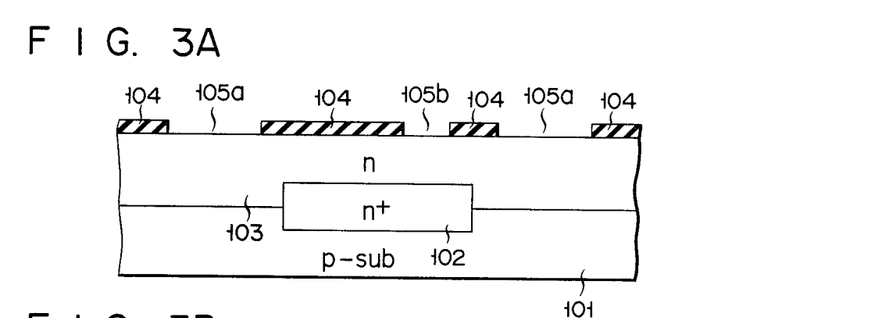
FIGS. 3A to 3F are cross sectional views corresponding to the sequential steps of manufacturing an npn type bipolar transistor by a method according to a first embodiment of this invention.

(i) An $n^+$ type layer 102 was selectively embedded in the surface of a p type silicon substrate 101, and an n type silicon layer 103 was grown by epitaxial growth on the entire surface of said silicon substrate 101. A $Si_3N_4$ layer 104 was deposited by CVD process over the whole of the mass. Photoetching was applied to those portions of said $Si_3N_4$ layer 104 which corresponded to an isolating region between elements and another isolating region in an element. This etching step produced a frame-shaped opening 105a and a narrow band-shaped opening 105b communicating with said frame-shaped opening 105a (FIG. 3A).

Figure 3B:
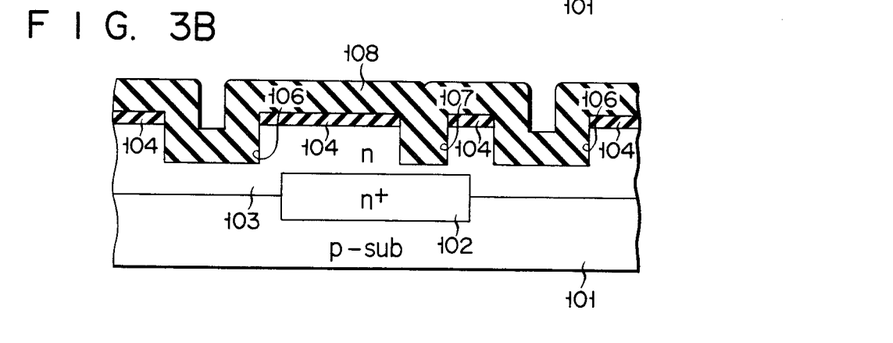

(ii) The reactive ion etching (RIE) process was applied to the silicon layer 103 exposed at the opening 105a, 105b with the $Si_3N_4$ layer 104 used as a mask, thereby providing a first, relatively broad, groove 106 and a second groove 107 narrower than the first groove 106. Thereafter, a $CVD-SiO_2$ layer 108 was deposited on the entire mass with a thickness less than half the width of the first groove 106 and yet greater than half the width of the second groove 107 (FIG. 3B).

Figure 3C:
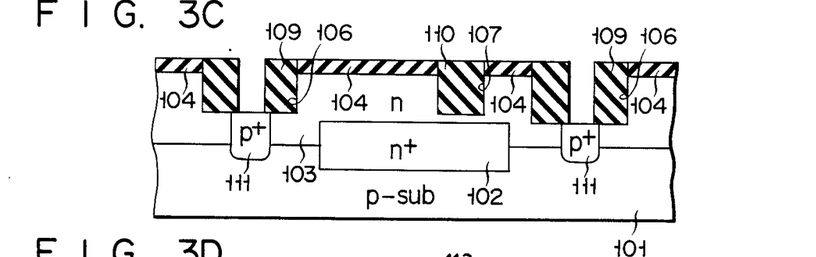

(iii) The $CVD-SiO_2$ layer 108 was etched off by the RIE process to an extent substantially equal to the thickness of the $CVD-SiO_2$ layer 108. At this time, etching proceede to the perpendicular direction to the main surface of the silicon layer 103. Therefore, the $CVD-SiO_2$ masking material 109 was retained on the inner side walls of the first broader groove 106. In contrast, the second, narrower groove 107 was fully filled with the $CVD-SiO_2$ masking material 110. Consequently, part of the bottom of the first groove 106 was exposed. In this case, it is possible to allow a thin $CVD-SiO_2$ masking layer to remain on the bottom of the first groove 106, instead of carrying out the aforesaid RIE process until the bottom is exposed. A p type impurity, for example, boron, was implanted into those portions of the silicon layer 103 which were exposed at the bottom of the first groove 106 with the Si$_3$N$_4$ layer 104 and CVD-SiO$_2$ layers 109, 110 applied as masks and was activated. As a result, a p+ type region 111 was formed in part of the bottom of the first groove 106 in a state extending down to the surface of the p type silicon substrate 101 (FIG. 3C).

Figure 3D:
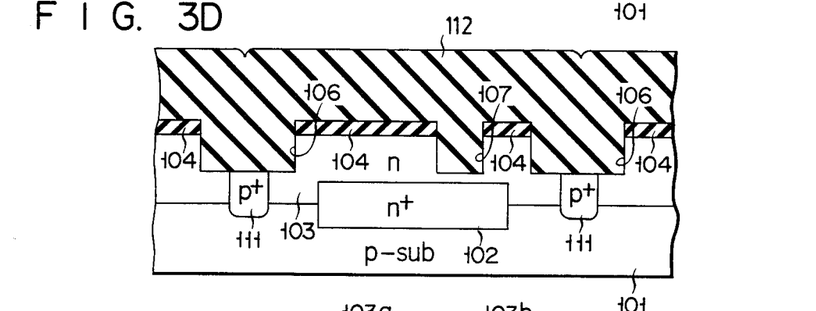

(iv) The CVD-SiO$_2$ masking materials 109, 110 were removed. A CVD-SiO$_2$ layer 112, acting as an isolating material, was deposited on the whole of the mass with a thickness greater than half the width of the first broad groove 106 to fully close the first and second grooves 106, 107 (FIG. 3D).

Figure 3E:
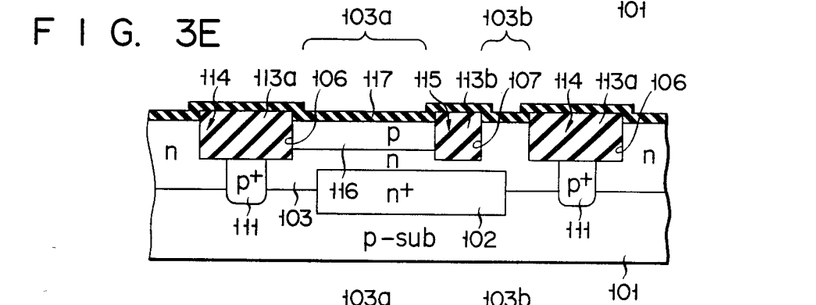

(v) The CVD-SiO$_2$ layer 112 was etched back by the RIE process until the Si$_3$N$_4$ layer was exposed to retain CVD-SiO$_2$ layers 113a, 113b in the first and second grooves 106, 107. As a result, the following were produced: an element-isolating region 114 consisting of a CVD-SiO$_2$ layer 113a and underlying p+ type region 111, and also an interelement-isolating region 115 consisting of a CVD-SiO$_2$ layer 113b. After the etching of the Si$_3$N$_4$ layer 104 used as a mask, boron was implanted in the silicon layer region 103a which was surrounded by the element-isolating region 114 and isolated by the isolating region 115 from another silicon layer 103b and was activated, thus forming a p type base region 116. Thereafter, an interlayer-insulating film 117 prepared from SiO$_2$ was deposited on the entire mass (FIG. 3E).

Figure 3F:
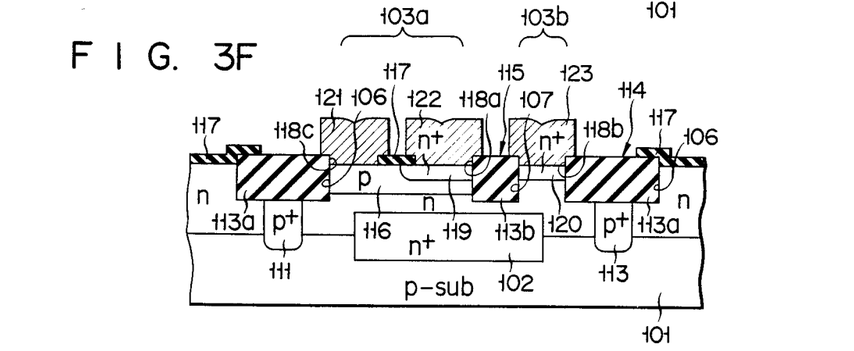

(vi) Photoetching was applied to that portion of the intervening film 117 which faced part of the aforesaid p type base region 116 and also that portion of said intervening insulating film 117 which faced another silicon layer region 103b which was surrounded by the element-isolating region 114 and isolated by the interelement-isolating region 115, thereby producing openings 118a, 118b. An n type impurity, for example, aresenic was implanted through said openings 118a, 118b, and thereafter activated, forming an n+ type emitter region 119 in the base region 116 and an n+ type collector electrode leadout region 120 in the aforesaid silicon layer region 103b. Photoetching was applied to that portion of the intervening insulating film 117 which faced the base region 116, thereby creating an opening 118c. Thereafter, an aluminium film was deposited on the entire mass. Said aluminium film was patterned to provide aluminium electrodes 121 to 123 connected to the base region 116 emitter region 119, and collector leadout region 120 through the openings 118c, 118a, and 118b. In this manner npn type bipolar transistor was finally manufactured.

The present invention allows for the formation of a deeper element-isolating region 114 which consists of the CVD-SiO$_2$ isolating material 113 and the underlying p+ region 111 provided in the form of self-alignment, and the provision of a shallower interelement-isolating region 115 consisting of the CVD-SiO$_2$ 113b (isolating material) in the silicon layer 103 surrounded by said deeper element-isolating region 114. Consequently, this invention provides a highly reliable npn type bipolar transistor which allows for reliable electric isolation and can be assembled with a high degree of integration. Further, if, as shown in the foregoing Example 1, the first and second grooves 106, 107 are simultaneously formed by applying the Si$_3$N$_4$ layer 104 provided with the openings 105a, 105b as a mask, then it is possible to produce the self-aligned element-isolating region 114 and interelement isolating region 115 thereby providing an npn bipolar transistor assembled with a still higher intergration degree.

EXAMPLE 2

Figure 4A:
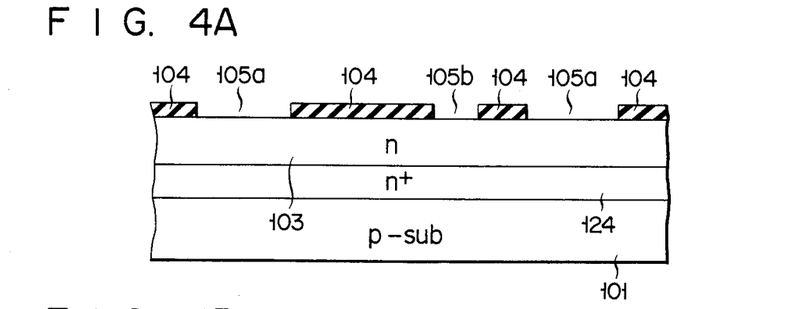
FIGS. 4A to 4F are cross sectional views corresponding to the sequential steps of manufacturing an npn type bipolar transistor by a metod according to the second embodiment of the invention.

(i) An n+ type silicon layer 124 was formed in a p type silicon substrate 101. An n type silicon layer 103 was allowed to grow over the entire surface of said n+ silicon layer 124. A Si$_3$N$_4$ mask layer 104 was formed by the same process as in Example 1. Openings 105a, 105b were respectively formed in those regions of the Si$_3$N$_4$ layer 104 which corresponded to an element-isolating region and an interelement-isolating region (FIG. 4A).

Figure 4B:
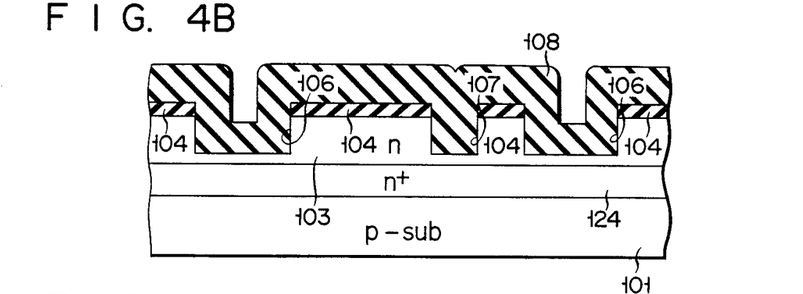
Figure 4C:
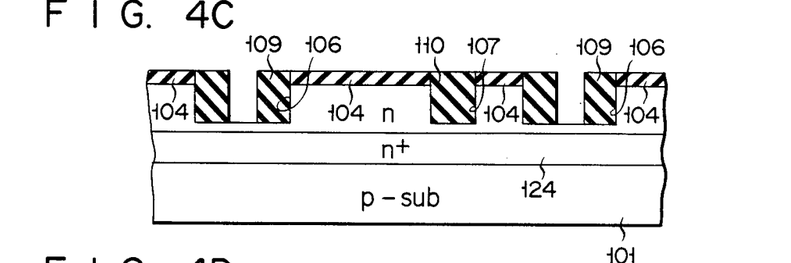

(ii) Those portions of the silicon layer 103 which were exposed in the openings 105a, 105b of the Si$_3$N$_4$ mask layer 104 were etched by the RIE process, thereby forming a first wide groove 106 and a second narrow groove 107. Thereafter, as shown in FIG. 4B, a CVD-SiO$_2$ layer 108 was deposited with the same thickness as that in Example 1. The CVD-SiO$_2$ layer 108 was etched off by the RIE process as in Example 1 to an extent substantially equal to the thickness of the CVD-SiO$_2$ layer to retain the CVD-SiO$_2$ mask layer 109 only on the inner side walls of the first groove 106. The second groove 107 was filled with the CVD-SiO$_2$ mask material 110 (FIG. 4C).

Figure 4D:
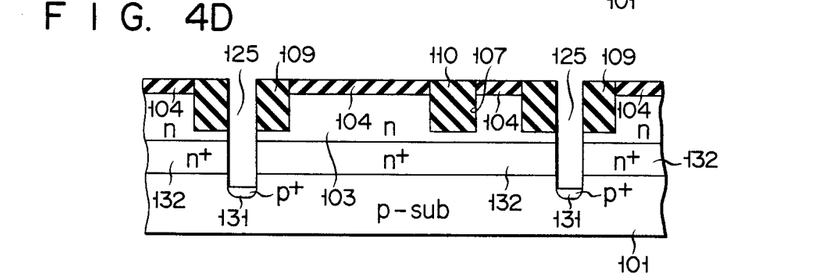

(iii) Etching was done by the RIE process, not only of the silicon layer 103 exposed at the bottom of the first groove 106, the inner side walls of which retain the CVD-SiO$_2$ mask layer 109, but also of the underlying n+ silicon layer 124 and part of the surface portion of the semiconductor substrate 101. As a result an annular deep groove 125 was formed (FIG. 4D). A p type impurity, for example, boron, was ion-implanted in that portion of the semiconductor substrate 101 which was exposed at the bottom of the deep groove 125, and further activation was applied, thereby providing a p+ type region 131 (FIG. 4D). The n+ silicon layer 124 was divided into a plurality of regions by the annular deep groove 125 to form n+ type embedded layers 132 in every element.

Figure 4E:
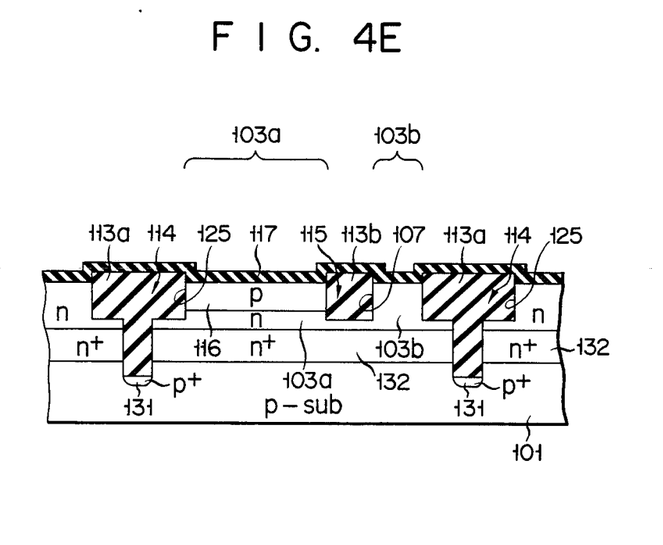

(iv) After the removal of the CVD-SiO$_2$ mask layers 109, 110, a CVD-SiO$_2$ layer (not shown) was deposited over the entire mass by the same process as applied in Example 1 with a thicknes greater than half the width of the wider deep groove 125. The CVD-SiO$_2$ layer was etched back by the RIE until the Si$_3$N$_4$ layer was exposed. As a result, the first deep groove 125 and second groove 107 were filled CVD-SiO$_2$ isolating materials 113a, 113b, thereby providing a deep element-isolating region 114 consisting of the CVD-SiO$_2$ material 113a and the underlying p+ region 131, and a shallow interelement-isolating region 115 (FIG. 4E).

After the removal of the Si$_3$N$_4$ layer 104, an impurity, for example, boron was ion-implemented in one region (103a) of the silicon layer regions 103a, 103b surrounded by the annular element-isolating region 114 and isolated from each other by the interelement-isolating region 115, and thereafter activation was applied, thereby providing a p typ base region 116. A SiO$_2$ intervening insulating film 117 was deposited over the entire mass (FIG. 4E).

Figure 4F:
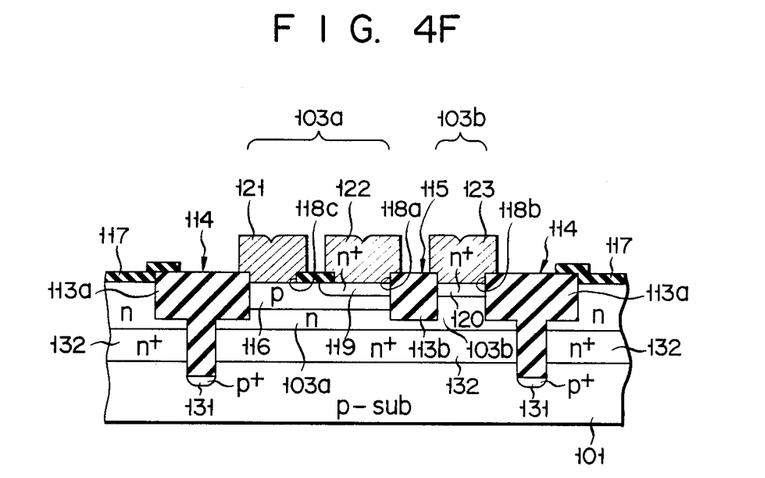

(v) By the same process as applied in Example 1, an n+ type emiter region 119 was formed in part of the base region 116, and an n+ type collector electrode leadout region 120 was formed in the surface portion of the other silicon layer region 103b. Further, aluminium electrodes 121 to 123 were provided, producing finally, an npn type bipolar transistor (FIG. 4F).

Like Example 1, Example 2 assures the manufacture of an npn type bipolar transistor of high reliability with a significant degree of integration. In Example 2, the CVD-SiO$_2$ layer 113a constituting the element-isolating region 114 penetrates the n type silicon layer 103 and n+ type silicon layer 124 and extends to the surface portion of the semiconductor substrate 101, and further the p+ type region 131 is formed in said surface portion. Consequently, a p+ type region 111 is not formed in the n type silicon layer 103, as is the case with Example 1. Therefore, the device illustrated in Example 2 can prevent a parasitic junction capacity from being produced by the pn junction. Further in Example 2, the n+ silicon layer 124 interposed between the semiconductor substrate 101 and n type silicon layer 103 is isolated by the deep groove 125 to form an n+ type embedded layer 132. Therefore, it is possible to dispense with a mask in forming said n+ type embedded layer 132 and produce said embedded layer 132 self-aligned with the element-isolating region 114.

Figure 5:
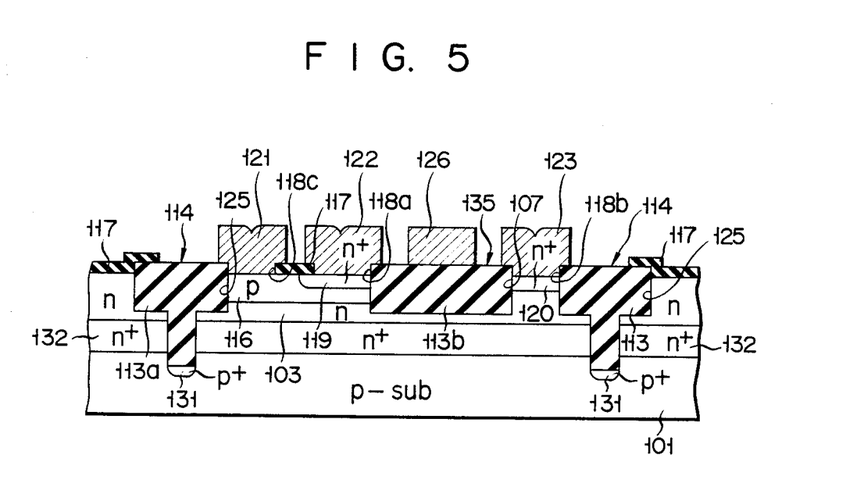
FIG. 5 illustrates a drawback accompanying the npn type bipolar transistor embodying the invention which might arise if a certain modification is made.
Figure 6:
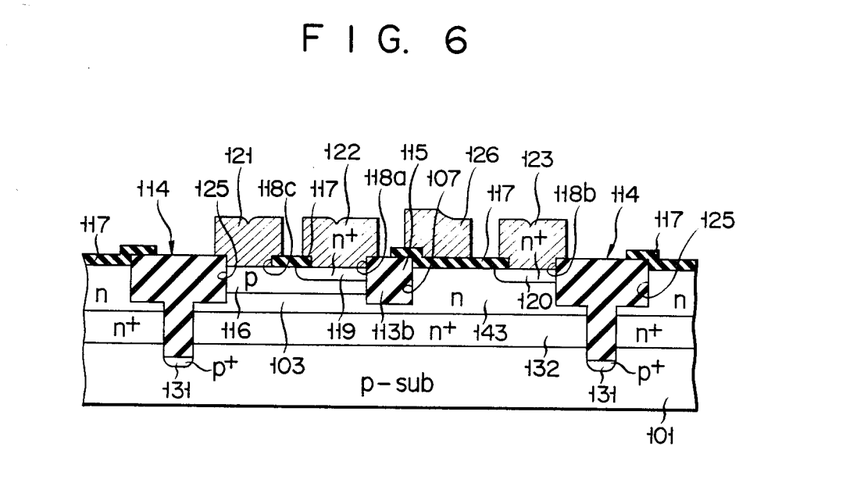
FIG. 6 is a cross sectional view of a modified npn type bipolar transistor in which the drawback shown in FIG. 5 is resolved.

In the semiconductor device manufacturing method described with reference to Example 2, occasionally, as shown in FIG. 5, an isolating region 135 lying between the emitter region 119 and collector region 120 is widened, and an aluminium wire is laid on said isolating region 135. However, the method of this inventon will not form such the wide, shallow isolating layer 135 indicated in FIG. 5. In such a case, it is advisable to: broaden, as shown in FIG. 6, the silicon layer region 143, which is interposed between the interelement-isolating region 115 and the element-isolating region 114 and on which a collector electrode leadout region is to be formed later; form an opening 118b in that portion of the intervening insulating film 117 which adjoins the element-isolating region 114; and lay an aluminium wire on that portion of the intervening insulating film 117 which is retained on said silicon layer region 143.

This invention is applicable not only to the manufacture of an npn type bipolar transistor but also to the formation of a deep isolating region intended to effect a channel cut or to suppress a latch-up in the proximity of the wells of a CMOS element. The application of the method of this invention increases the quality of the CMOS element and assures its high integration.

What is claimed is:

1. A method for manufacturing a semiconductor device, comprising the steps of:
    forming a first groove in a semiconductor substrate surrounding that section of said semiconductor substrate in which an isolation is to be formed and a second groove narrower than said first groove in said section of said semiconductor substrate which is surrounded by said first groove;
    depositing a first layer of isolating material over the entire surface of said semiconductor substrate, said first layer having a thickness less than half the width of said first groove and greater than half the width of said second groove;
    anisotropically etching said first layer of isolating material to eliminate substantially its thickness, thus leaving said first layer of isolating material on the side walls of said first groove and entirely in said second groove;
    introducing an impurity into the bottom of said first groove, using said first layer of isolating material remaining on said side walls of said first groove as a mask, thereby forming an impurity region;
    filling said first groove with a second layer of isolating material, thus leaving said first and second grooves entirely filled with said isolating material; and
    forming a semiconductor element in said section of said semiconductor substrate which is surrounded by said impurity region and said isolating material in said first groove.

2. The method according to claim 1, wherein said isolating material is selected from the group consisting of SiO$_2$, Si$_3$N$_4$, Al$_2$O$_3$, PSG, AsSG and BSG.

3. The method according to claim 1, wherein said step of filling said first groove with a second layer of isolating material includes:
    removing said first layer of isolating material from said side walls of said first groove and from said second groove;
    depositing a second layer of isolating material over the entire surface of said semiconductor substrate, said second layer having a thickness greater than half the width of said first groove; and
    etching said second layer of isolating material to eliminate substantially its thickness, thus leaving said first and second grooves entirely filled with said isolating material.

4. The method according to claim 3, wherein said isolating material is selected from the group consisting of SiO$_2$, Si$_3$N$_4$, Al$_2$O$_3$, PSG, AsSG, BSG, polycrystalline silicon and amorphous silicon.

5. The method according to claim 1, further comprising the step of forming a semiconductor substrate by forming a substrate layer of a first conductivity typ, forming a semiconductor layer of a second conductivity type on said substrate layer, and selectively forming a semiconductor region of high impurity concentration on an interface defined between said substrate layer and said semiconductor, and wherein:
    said groove-forming step includes forming said first and second grooves in said semiconductor layer;
    said impurity-introducing step includes forming an impurity region to extends from the bottom of said first groove to said substrate layer;
    said step of filling said first groove with a second layer of isolating material includes isolating said semiconductor layer surrounded by said first groove filled with said isolating material and said impurity region into two semiconductor regions, said two semiconductor regions being isolated from each other by said isolating material formed in said second groove, and
    said step of forming a semiconductor element includes forming a base region of said first conductivity type in one of said two semiconductor regions, forming an emitter region of said second conductivity type in part of said base region, and forming a collector leadout region of said second conductivity type in the other semicondcutor region.

6. A method for manufacturing a semiconductor device, comprising the steps of:
    forming a first groove in a semiconductor substrate surrounding that section of said semiconductor substrate in which an isolation is to be formed and a second groove narrower than said first groove in said section of said semiconductor substrate which is surrounded by said first groove;
    depositing a first layer of isolating material over the entire surfae of said semiconductor substrate, said first layer having a thickness less than half the width of said first groove and greater than half the width of said second groove;

anisotropically etching said first layer of isolating material to eliminate substantially its thickness, thus leaving said first layer of isolating material on the side walls of said first groove and entirely in said second groove;

etching the bottom of said first groove, using said first layer of isolating material remaining on said side walls of said first groove as a mask, thereby forming a third groove;

filling said first and third grooves with a second layer of isolating material, thus leaving said first and second grooves entirely filled with said isolating material; and forming a semiconductor element in said section of said semiconductor substrate which is surrounded by said isolating material in said first and third grooves.

7. The method according to claim 6, wherein said isolating material is selected from the group consisting of $SiO_2$, $Si_3N_4$, $Al_2O_3$, PSG, AsSG and BSG.

8. The method according to claim 6, wherein said step of filling said first and third grooves with a second layer of isolating material includes:

removing said first layer of isolating material from said side walls of said first groove and from said second groove;

depositing a second layer of isolating material over the entire surface of said semiconductor substrate, said second layer having a thickness greater than half the width of said first groove; and etching said second layer of isolating material to eliminate substantially its thickness, thus leaving said first, second and third grooves entirely filled with said isolating material.

9. The method according to claim 8, wherein said isolating material is selected from the group consisting of $SiO_2$, $Si_3N_4$, $Al_2O_3$, PSG, AsSG, BSG, polycrystalline silicon and amorphous silicon.

10. The method according to claim 6, further comprising the step of forming a semiconductor substrate by forming a substrate layer of a first conductivity type, forming a semiconductor layer of a second conductivity type on said substrate layer, and selectively forming a semiconductor region of high impurity concentration on an interface defined between said substrate layer and said semiconductor layer, and wherein:

said groove-forming step includes forming said first and second grooves in said semiconductor layer;

said step of etching the bottom of said first groove includes forming said third groove to extend to said substrate layer;

said step of filling said first and third grooves with a second layer of isolating material includes isolating said semiconductor layer surrounded by said first and third grooves filled with said into two semiconductor regions, said two semiconductor regions being isolated from each other by said isolating material formed in said second groove, and said step of forming a semiconductor element includes forming a base region of said first conductivity type in one of said two semiconductor regions, forming an emitter region of said second conductivity type in part of said base region, and forming a collector leadout region of said second conductivity type in the other semiconductor region.

11. A method of forming an isolated semiconductor on a semiconductor substrate, comprising the steps of:

forming a frame-shaped first groove in said semiconductor substrate and a band-shaped second groove within and communicating with said frame-shaped first groove, said second groove having a width less than the width of said first groove;

depositing a layer of masking material over the entire surface of said semiconductor substrate, said layer of masking material having a thickness less than half the width of said first groove and greater than half the width of said second groove;

anisotropically etching said layer of masking material to eliminate substantially its thickness, thus exposing the bottom surface of said first groove while leaving said masking material on the side walls of said first groove and entirely filling said second groove with said masking material;

introducing an impurity to said exposed bottom surface of said first groove, using said masking material remaining on said side walls of said first groove as a mask, thereby forming a frame-shaped impurity region;

removing said masking material from said first and second grooves;

depositing a layer of isolting material over the entire surface of said semiconductor substrate, said layer of isolating material having a thickness greater than half the width of said first groove;

anisotropically etching said layer of isolating material to eliminate substantially its thickness, thus leaving said first and second grooves entirely filled with said isolating material; and forming a semiconductor element in the section of said semiconductor substrate surrounded by said frame-shaped first groove filled with said isolating material and said frame-shaped impurity region, one of the components of said semiconductor element being separated from the other components of said semiconductor element by said isolating material formed in said second groove.

12. A method of forming an isolated semiconductor on a semiconductor substrate, comprising the steps of:

forming a frame-shaped first groove in said semiconductor substrate and a band-shaped second groove within and communicating with said frame-shaped first groove, said second groove having a width less than the width of said first groove;

depositing a layer of masking material over the entire surface of said semiconductor substrate, said layer of masking material having a thickness less than half the width of said first groove and greater than half the width of said second groove;

anisotropically etching said layer of masking material to eliminate substantially its thickness, thus exposing the bottom surface of said first groove while leaving said masking material on the side walls of said first groove and entirely filling said second groove with said masking material;

etching said exposed bottom of said first groove, using said masking material remaining on said side walls of said first groove as a mask, thereby forming a frame-shaped third groove;

removing said masking material from said first and second grooves;

depositing a layer of isolating material over the entire surface of said semiconductor substrate, said layer of isolating material having a thickness greater than half the width of said first groove;

anisotropically etching said layer of isolating material to eliminate substantially its thickness, thus leaving said first, second and third grooves entirely filled with said isolating material; and forming a semiconductor element in the section of said semiconductor substrate surrounded by said frame-shaped first and second grooves filled with said isolating material, one of the components of said semiconductor element being separated from the other components of said semiconductor element by said isolating material formed in said second groove.

* * * * *